United States Patent
Dempsey et al.

(10) Patent No.: US 7,068,193 B2
(45) Date of Patent: Jun. 27, 2006

(54) INTEGRATED DIGITAL CALIBRATION CIRCUIT AND DIGITAL TO ANALOG CONVERTER (DAC)

(75) Inventors: Dennis A. Dempsey, Crecora (IE); Thomas G. O'Dwyer, Clonlara (IE); Oliver J. Brennan, Adare (IE); Alan Walsh, Tullamore (IE); Tudor Vinereanu, Frenches Quay (IE)

(73) Assignee: Analog Devices, Inc., Norwood, MA (US)

( * ) Notice: Subject to any disclaimer, the term of this patent is extended or adjusted under 35 U.S.C. 154(b) by 0 days.

(21) Appl. No.: 10/627,500

(22) Filed: Jul. 25, 2003

(65) Prior Publication Data

US 2004/0085234 A1 May 6, 2004

Related U.S. Application Data (60) Provisional application No. 60/414,166, filed on Sep. 27, 2002, and provisional application No. 60/413,909, filed on Sep. 26, 2002.

(51) Int. Cl.
*H03M 1/10* (2006.01)

(52) U.S. Cl. ....................................................... 341/120

(58) Field of Classification Search ................ 341/118, 341/120, 155
See application file for complete search history.

(56) References Cited

U.S. PATENT DOCUMENTS

| | | |
|---|---|---|
| 3,878,749 A | 4/1975 | Woron |
| 4,212,072 A | 7/1980 | Huelsman et al. |
| 4,222,107 A | 9/1980 | Mrozowski et al. |
| 4,829,236 A | 5/1989 | Brenardi et al. |
| 4,835,535 A | 5/1989 | Shibayama et al. |
| 5,012,241 A | 4/1991 | Kuttner |
| 5,054,039 A | 10/1991 | Blackmon et al. |
| 5,134,401 A | 7/1992 | McCartney et al. |
| 5,248,970 A | 9/1993 | Sooch et al. |
| 5,343,196 A | 8/1994 | Harston |
| 5,442,355 A | 8/1995 | Cummins |
| 5,570,090 A | 10/1996 | Cummins |
| 5,583,501 A | 12/1996 | Henrion et al. |
| 5,594,612 A | 1/1997 | Henrion |
| 5,642,116 A | 6/1997 | Gersbach |
| 5,666,118 A | 9/1997 | Gersbach |
| 5,703,586 A * | 12/1997 | Tucholski ................... 341/144 |
| 5,760,720 A | 6/1998 | Nolan et al. |
| 5,969,657 A | 10/1999 | Dempsey et al. |
| 5,995,033 A | 11/1999 | Roeckner et al. |
| 6,191,715 B1 * | 2/2001 | Fowers ....................... 341/120 |
| 6,208,278 B1 | 3/2001 | Toosky |
| 6,226,562 B1 | 5/2001 | Philpott |
| 6,292,125 B1 | 9/2001 | Conroy |
| 6,351,228 B1 * | 2/2002 | Kutsuno et al. ............ 341/120 |
| 6,392,574 B1 | 5/2002 | Toosky |
| 6,456,112 B1 | 9/2002 | Perez |
| 6,667,703 B1 * | 12/2003 | Reuveni et al. ............. 341/120 |

OTHER PUBLICATIONS

Analog Devices Inc., Analog–Digital Conversion Handbook, 3rd Edition, Edited by Sheingold, 1986, pp. 173–175.*

(Continued)

*Primary Examiner*—Howard L. Williams
(74) *Attorney, Agent, or Firm*—Iandiorio & Teska (57) ABSTRACT

An integrated digital calibration circuit and digital to analog converter includes a digital to analog converter (DAC) and a digital calibration circuit including a memory for storing predetermined end point coefficients of the digital to analog converter transfer function; and an arithmetic logic unit for applying the end point coefficients to the DAC input signal to adjust the end points of the DAC and/or analog signal chain.

58 Claims, 6 Drawing Sheets

OTHER PUBLICATIONS

Analog Devices, Inc., *High Quality, 10–Bit Digital CCIR–601 to PAL/NTSC Video Encoder*, Product Brochure ADV7175A/ADV7176A Rev. C, <http://www.analog.com/>(2000) year only.

K.G. Beauchamp, 1975, *Walsh Functions and Their Applications*, Academic Press, London, pp. v–xiii, 1–51, 140–165, 184–189 no month given.

Erwin Kreyzig, 1999, *Advanced Engineering Mathematics*.John Wiley & Sons, 8th Ed., pp. xi–xvi, 990–1008 no month given.

Gilbert Strang, 1986, *Introduction to Applied Mathematics*. Wellesley–Cambridge Press, pp. i–iii, 31–35, 366–455, 718–725 no month given.

K.A. Stroud, *Advanced Engineering Mathmatics*, 4th Ed., pp. 520–533 no date given.

S.G. Tzafestas (Ed.), 1985, *Walsh Functions in Signal and Systems Analysis and Design*, Van Nostrand Reinhold, New York, pp. v–viii, 1–22 no month given.

J.L. Walsh, *A Closed Set of Normal Orthogonal Functions*, 45 Amer. J. Math., 5–24 (1923) no month given.

\* cited by examiner

INTEGRATED DIGITAL CALIBRATION CIRCUIT AND DIGITAL TO ANALOG CONVERTER (DAC)

RELATED APPLICATIONS

This application claims priority of U.S. Provisional Ser. No. 60/413,909, Dempsey et at entitled DIGITAL-TO-ANALOG CONVERTER SYSTEM CALIBRATION, filed Sep. 26, 2002; and U.S. Provisional Ser. No. 60/414,166, Dempsey et al. entitled DIGITAL-TO-ANALOG CONVERTER CALIBRATION ARCHITECTURE & SCHEME, filed Sep. 27, 2002.

FIELD OF THE INVENTION

This invention relates to an integrated digital calibration circuit and digital to analog converter (DAC) for adjusting, modifying, modulating or correcting DAC transfer function end points.

BACKGROUND OF THE INVENTION

Adjustment and control of DAC end points e.g. zero scale, full scale or gain and offset is desirable in a number of circumstances. One of the more important uses is end point error correction. That is correction of zero scale and full scale errors and gain and offset errors.

Digital to analog converter (DAC) transfer function end point errors e.g. zero scale and full scale errors; offset and gain errors have historically been a problem effecting (DAC) accuracy. Previous attempts to reduce such errors have included laser trimming which applied to resistors only and required special hardware and wafer fabrication techniques and added significantly to the cost. Mixed signal (analog/digital) calibration is another approach but its results can be risky, performance is limiting and less dependable. It too increases expense. One common approach is to design for the optimal nominal desired result. But the higher the accuracy desired the greater the expense: more precision design and production required, added software and/or circuitry and more expensive fabrication techniques. In addition, compensating for such errors in systems including the DACs, and their preceding reference path plus subsequent analog chain of circuits (i.e. analog signal chain) requires even greater complexity and expense either in additional and highly accurate integrated circuitry or calibrating system(s) procedures integrated into the system software.

BRIEF SUMMARY OF THE INVENTION

It is therefore an object of this invention to provide an improved integrated programmable digital calibration circuit and digital to analog converter (DAC) to adjust DAC transfer function end points.

It is a further object of this invention to provide an improved integrated programmable digital calibration circuit and digital to analog converter (DAC) which provides accuracy and performance while maintaining lower cost and complexity.

It is a further object of this invention to provide an improved integrated programmable digital calibration circuit which employs a wholly digital, less expensive approach.

It is a further object of this invention to provide an improved integrated programmable digital calibration circuit which can adjust end points not only in the DAC but in associated analog circuitry as well.

It is a further object of this invention to provide an improved integrated programmable digital calibration circuit which reduces demands on external control circuits such as microcontrollers, DSPs and CPUs.

It is a further object of this invention to provide an improved integrated programmable digital calibration circuit which can adjust zero scale and full scale and gain and offset.

It is a further object of this invention to provide an improved integrated digital calibration circuit and digital to analog converter (DAC) to compensate for DAC transfer function end point error.

It is a further object of this invention to provide an improved integrated digital calibration circuit and digital to analog converter (DAC) which provides greater accuracy and performance while maintaining lower cost and complexity.

It is a further object of this invention to provide an improved integrated digital calibration circuit which employs a wholly digital less expensive approach.

It is a further object of this invention to provide an improved integrated digital calibration circuit which can reduce errors not only in the DAC but in associated analog circuitry as well.

It is a further object of this invention to provide an improved integrated digital calibration circuit which reduces demands on external control circuits such as microcontrollers, DSP's and CPU's.

It is a further object of this invention to provide an improved integrated digital calibration circuit which can correct zero scale and full scale errors and gain and offset errors.

The invention results from the realization that a simple and inexpensive, but much more accurate, DAC can be achieved by integrating a calibration unit with the DAC to provide the DAC transfer function end point coefficients, e.g. gain and offset coefficients, zero scale and full scale coefficients, digitally, to the DAC, which coefficients can be stored externally or internally, on the calibration circuit or on a chip which holds both the calibration circuit and the DAC, and can be applied to adjust the DAC end points or the DAC end points and the end points of the analog circuits associated with the DAC and further the memory can be made user accessible for post fabrication error correction programming for the DAC and/or associated analog circuits.

This invention features a programmable integrated digital calibration circuit and digital to analog converter including a digital to analog converter (DAC) and a digital calibration circuit including a memory for storing predetermined of the end point coefficients of the digital to analog converter transfer function and an arithmetic logic unit for applying the coefficients of the end points to the DAC input signal to adjust the end points of the DAC.

In a preferred embodiment the end point coefficients may include the offset coefficient and gain coefficient. The arithmetic logic unit may include an arithmetic circuit having a multiplier circuit for multiplying the DAC input by the gain coefficient and an adder circuit for adding the offset coefficient to the input signal. The end point coefficients may include the zero scale and full scale coefficients. The arithmetic logic unit may include an arithmetic circuit for algebraically using the zero scale output and ideal output and normalizing them in respect to the least significant bit (LSB) value to obtain the zero scale coefficient and combining the full scale output and ideal output and normalizing them in respect to the LSB to obtain the full scale coefficient and applying those coefficients to the input signal to the DAC. The digital calibration circuit and DAC may be on the same integrated circuit chip. The memory may be in the digital calibration circuit. The memory may be external to the digital calibration circuit. The memory may be a user accessible programmable memory.

The invention also features a programmable digital calibration system including an integrated digital calibration circuit and digital to analog converter including a digital to analog converter (DAC) and an analog signal circuit responsive to the DAC. A digital calibration circuit includes a memory for storing the predetermined end point coefficient of the DAC transfer function and includes an arithmetic logic unit for applying the end point coefficients to the DAC input signal to compensate for the end point coefficients of the DAC and the analog signal circuit.

In a preferred embodiment the digital calibration circuit and DAC may be on the same integrated circuit chip. The memory may be in the digital calibration circuit or may be external to the digital calibration circuit. The memory may be a user accessible programmable memory.

The invention also features a programmable integrated digital calibration circuit and digital to analog converter including a digital to analog converter and a digital calibration circuit including a memory for storing the predetermined offset coefficient and gain coefficient of the digital to analog converter (DAC) and an arithmetic logic unit including an arithmetic circuit having a multiplier circuit for multiplying the DAC input by the gain coefficient and an adder circuit for adding the offset coefficient to the input signal to adjust the gain and offset errors of the DAC.

In a preferred embodiment the digital calibration circuit and DAC may be on the same integrated circuit chip. The memory may be in the digital calibration circuit or may be external to the digital calibration circuit. The memory may be a user accessible programmable memory.

The invention also features a programmable digital calibration system including an integrated digital calibration circuit and digital to analog converter including a digital to analog converter (DAC) and an analog signal circuit responsive to the DAC. A digital calibration circuit includes a memory for storing the predetermined offset coefficient and gain coefficient of the DAC and the analog signal circuit and includes an arithmetic logic unit including an arithmetic circuit having a multiplier circuit for multiplying the DAC input by the gain coefficient and an adder circuit for adding the offset coefficient to the input signal to adjust the gain and offset of the DAC and the analog signal circuit.

In preferred embodiments the digital calibration circuit and DAC may be on the same integrated circuit chip. The memory may be in the digital calibration circuit or may be external to it. The memory may be a user accessible programmable memory.

The invention also features an integrated programmable digital calibration circuit and digital to analog converter including a digital to analog converter (DAC) and a digital calibration circuit including a memory for storing predetermined zero scale and full scale coefficients of the digital to analog converter DAC and an arithmetic logic unit including an arithmetic circuit for algebraically combining the zero scale output and ideal output and normalizing them by the least significant bit (LSB) value to obtain the zero scale coefficient and combining the full scale output and ideal output and normalizing them by the LSB to obtain the full scale coefficient and applying those coefficients to the input signal to the DAC to adjust the zero scale and full scale of said DAC.

In a preferred embodiment the digital calibration circuit and DAC are on the same integrated circuit chip. The memory may be in the digital calibration circuit or may be external to it and the memory may be user accessible programmable memory.

The invention also features a programmable digital calibration system including an integrated digital calibration circuit and digital to analog converter including a digital to analog converter (DAC) and an analog signal circuit responsive to the DAC. A digital calibration circuit includes a memory for storing predetermined zero scale and full scale coefficients of the DAC and the analog signal circuit and an arithmetic logic unit including an arithmetic circuit for algebraically combining the zero scale output and ideal output and normalizing them by the least significant bit (LSB) value to obtain the zero scale coefficient and combining the full scale output and ideal output and normalizing them by the LSB to obtain the full scale error coefficient and applying those coefficients to the input signal to the DAC to adjust the zero scale and full scale offset of the DAC and the analog signal circuit.

In a preferred embodiment the digital calibration circuit and DAC are on the same integrated circuit chip. The memory may be in the digital calibration circuit or external to it and the memory may be a user accessible programmable memory.

This invention features an integrated digital calibration circuit and digital to analog converter including a digital to analog converter (DAC) and a digital calibration circuit including a memory for storing predetermined complements of the end point errors of the digital to analog converter transfer function and an arithmetic logic unit for applying the complements of the end point errors to the DAC input signal to compensate for the end point errors of the DAC.

In a preferred embodiment the complements of the end point errors may include the offset error and gain error. The arithmetic logic unit may include an arithmetic circuit having a multiplier circuit for multiplying the DAC input by the gain error coefficient and an adder circuit for adding the offset error coefficient to the input signal. The complements of the end point errors may include the zero scale and full scale error coefficients. The arithmetic logic unit may include an arithmetic circuit for algebraically counting the zero scale output and ideal output and normalizing them by the least significant bit (LSB) value to obtain the zero scale error and combining the full scale output and ideal output and normalizing them by the LSB to obtain the full scale error coefficient and applying those error coefficients to the input signal to the DAC. The digital calibration circuit and DAC may be on the same integrated circuit chip. The memory may be in the digital calibration circuit. The memory may be external to the digital calibration circuit. The memory may be a user accessible programmable memory.

The invention also features a digital calibration system including an integrated digital calibration circuit and digital to analog converter including a digital to analog converter (DAC) and an analog signal circuit responsive to the DAC. A digital calibration circuit includes a memory for storing the predetermined complements of the end point error of the DAC transfer function and includes an arithmetic logic unit for applying the complements of the end point error to the DAC input signal to compensate for the end point errors of the DAC and the analog signal circuit.

In a preferred embodiment the digital calibration circuit and DAC may be on the same integrated circuit chip. The memory may be in the digital calibration circuit or may be external to the digital calibration circuit. The memory may be a user accessible programmable memory.

The invention also features an integrated digital calibration circuit and digital to analog converter including a digital to analog converter and a digital calibration circuit including a memory for storing the predetermined offset error coefficient and gain error coefficient of the digital to analog converter (DAC) and an arithmetic logic unit including an arithmetic circuit having a multiplier circuit for multiplying the DAC input by the gain error coefficient and an adder circuit for adding the offset error coefficient to the input signal to compensate the gain and offset errors of the DAC.

In a preferred embodiment the digital calibration circuit and DAC may be on the same integrated circuit chip. The memory may be in the digital calibration circuit or may be external to the digital calibration circuit. The memory may be a user accessible programmable memory.

The invention also features a digital calibration system including an integrated digital calibration circuit and digital to analog converter including a digital to analog converter (DAC) and an analog signal circuit responsive to the DAC. A digital calibration circuit includes a memory for storing the predetermined offset error coefficient and gain error coefficient of the DAC and the analog signal circuit and includes an arithmetic logic unit including an arithmetic circuit having a multiplier circuit for multiplying the DAC input by the gain error coefficient and an adder circuit for adding the offset error coefficient to the input signal to compensate the gain and offset error of the DAC and the analog signal circuit.

In preferred embodiments the digital calibration circuit DAC may be on the same integrated circuit chip. The memory may be in the digital calibration circuit or may be external to it. The memory may be a user accessible programmable memory.

The invention also features an integrated digital calibration circuit and digital to analog converter including a digital to analog converter (DAC) and a digital calibration circuit including a memory for storing predetermined zero scale and full scale error coefficients of the digital to analog converter DAC and an arithmetic logic unit including an arithmetic circuit for algebraically combining the zero scale output and ideal output and normalizing them by the least significant bit (LSB) value to obtain the zero scale error coefficient and combining the full scale output and ideal output and normalizing them by the LSB to obtain the full scale error coefficient and applying those error coefficients to the input signal to the DAC to compensate for the zero scale and full scale errors of said DAC.

In a preferred embodiment the digital calibration circuit and DAC are on the same integrated circuit chip. The memory may be in the digital calibration circuit or may be external to it and the memory may be user accessible programmable memory.

The invention also features a digital calibration system including an integrated digital calibration circuit and digital to analog converter including a digital to analog converter (DAC) and an analog signal circuit responsive to the DAC. A digital calibration circuit includes a memory for storing predetermined zero scale and full scale error coefficients of the DAC and the analog signal circuit and an arithmetic logic unit including an arithmetic circuit for algebraically combining the zero scale output and ideal output and normalizing them by the least significant bit (LSB) value to obtain the zero scale error coefficient and combining the full scale output and ideal output and normalizing them by the LSB to obtain the full scale error coefficient and applying those error coefficients to the input signal to the DAC to compensate for the zero scale and full scale offset errors of the DAC and the analog signal circuit.

In a preferred embodiment the digital calibration circuit and DAC are on the same integrated circuit chip. The memory may be in the digital calibration circuit or external to it and the memory may be a user accessible programmable memory.

BRIEF DESCRIPTION OF THE DRAWINGS

Other objects, features and advantages will occur to those skilled in the art from the following description of a preferred embodiment and the accompanying drawings, in which.

DISCLOSURE OF THE PREFERRED EMBODIMENT

Aside from the preferred embodiment or embodiments disclosed below, this invention is capable of other embodiments and of being practiced or being carried out in various ways. Thus, it is to be understood that the invention is not limited in its application to the details of construction and the arrangements of components set forth in the following description or illustrated in the drawings.

The invention contemplates the adjustment of DAC end points or DAC plus analog signal current chain end points for any reason of control or adjustment. However, one of the more important applications is to correct end point errors such as zero scale, full scale errors and gain and offset errors. This error correction application is the subject of the specific embodiment disclosed but is by no means a limitation of the scope of the invention which includes end point adjustment for any reason.

Figure 1:
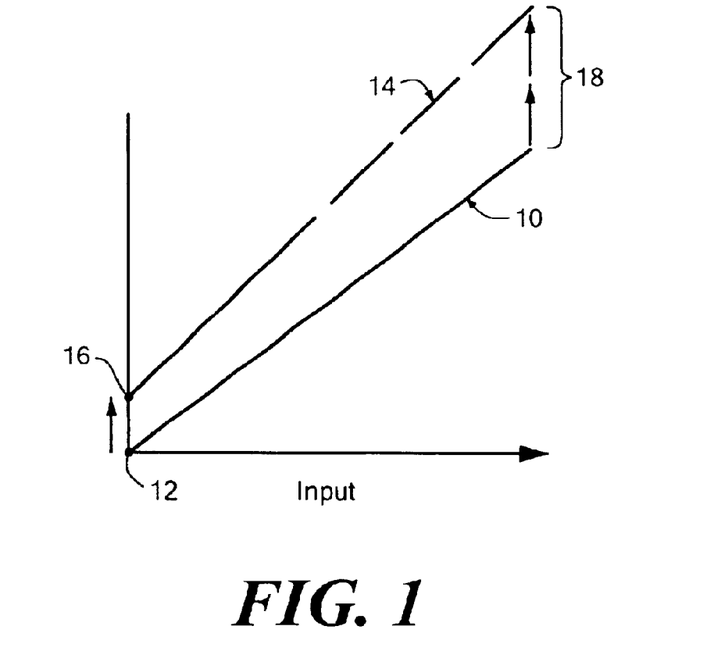
FIG. 1 is a graphical illustration of a digital to analog converter (DAC) transfer function showing end point errors as gain and offset errors.

Digital to analog converter (DAC) transfer function end point errors can be treated as gain and offset errors or as zero scale and full scale errors. There is shown in FIG. 1 a view of the gain and offset error approach. An ideal DAC transfer function 10 begins at the zero point, 12, and has a predetermined slope or gain. The actual transfer function 14 would typically start at some offset 16 from zero introducing the offset error and will have a slope or gain which is somewhat different than the slope or gain of the ideal transfer function 10. The deviation caused by the gain error in addition to the offset error combine to form the gain and offset error 18. Typically the coefficient to correct the offset error is referred to as c and the coefficient to correct the gain error is referred to as m.

Figure 2:
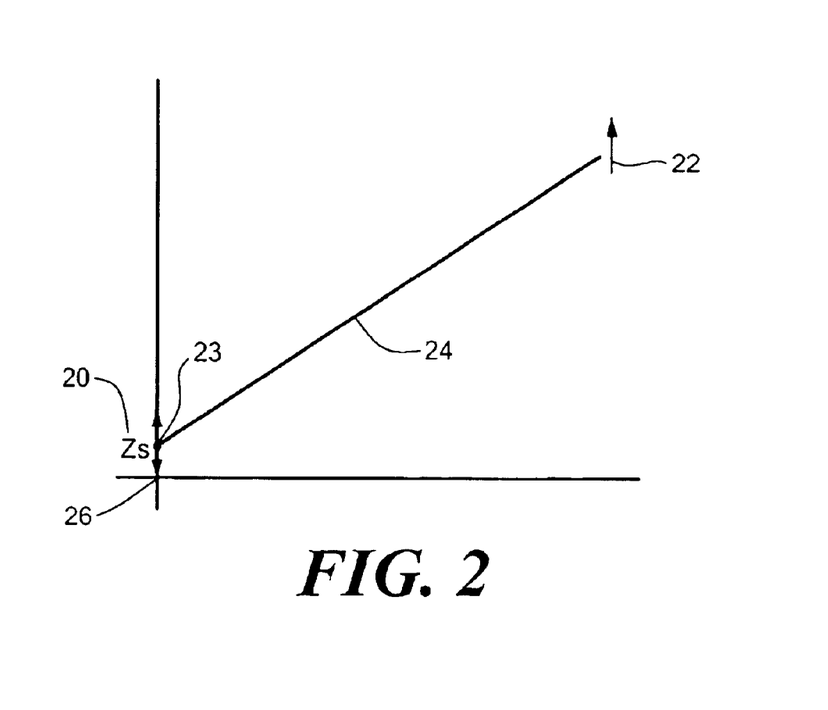
FIG. 2 is a graphic illustration of a digital to analog converter (DAC) transfer function showing end point errors as zero scale and full scale errors.

In another view, FIG. 2 the end point errors are viewed as zero scale errors 20 and full scale errors 22. The zero scale error occurs because the zero position, 23, of the transfer function 24 may not be at the ideal zero point, 26, and the full scale error occurs because the full scale point varies in dependence on errors that effect the gain or slope of the transfer function 24 and due to errors in the zero position, 23.

Figure 3:
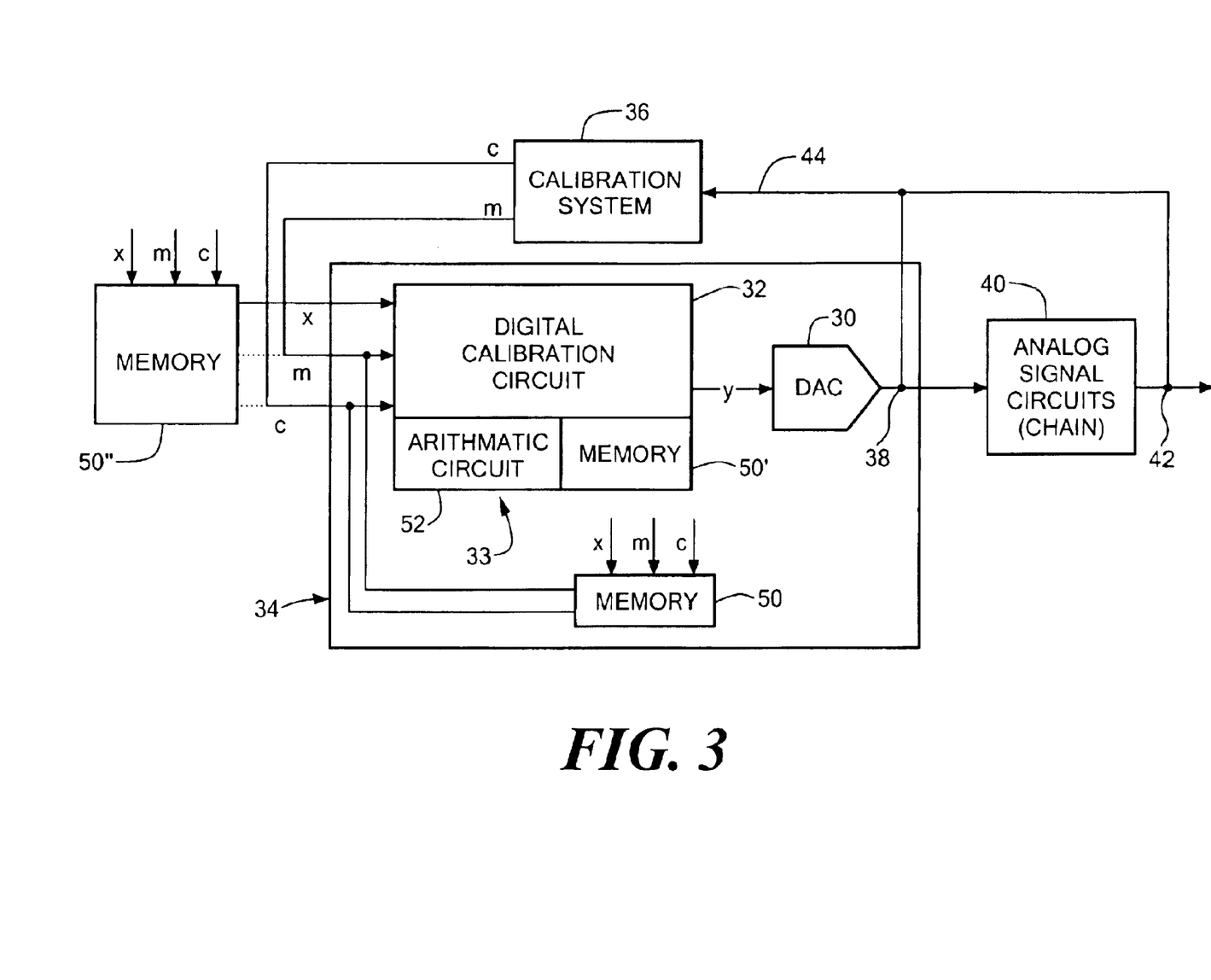
FIG. 3 is a simplified schematic block diagram of an integrated digital calibration circuit and DAC employing gain and offset coefficients according to this invention.

In one embodiment according to this invention a DAC 30, FIG. 3, and digital calibration circuit 32 are integrated on a single chip 34. A calibration system 36 senses the output of DAC 30 at 38 or if desired the output from DAC 30 and the subsequent analog signal circuits or analog signal chain 40 at output 42. In this way the errors of the entire analog chain, including the DAC, can be compensated for. In either case, the signal is coupled via line 44 to calibration system 36 which delivers the offset error coefficient c and the gain error coefficient m to digital calibration circuit 32 where these values are used to calculate y where x is the input signal and y is the output signal. Simply stated $$y = mx + c \quad (1)$$

where y is the output, m is the gain or slope error coefficient, c is the offset coefficient and x is the input.

Equation No. 1 is a classic, generic textbook linear algebraic expression, using real numbers by default. In the case of a digital to analog converter the digital input of the DAC has finite, quantized resolution. Hence, quantized, finite resolution digital numbers are appropriate in the expressions for DACs. For this reason, we use a modified version of this expression in practice:

$$y = (m + c2)/d + c \quad \text{Eq (2)}$$

where: c2 is a second constant digital term and d is a divider factor used to scale down the output number.

A specific, preferred embodiment is:

$$y = ((m+1)*/2\hat{}N)*x + c \quad \text{Eq (3)}$$

If the gain factor (m) has N effective bits of resolution, the maximum (or fullscale) m value=$2\hat{}N-1$. In equation (2), with fullscale m (m=$2\hat{}N-1$), the effective gain=$(2\hat{}N-1+1)/2\hat{}N=1$.

The choice of "+1" factor in equation (2) is for implementation reasons. M=$2\hat{}N-1$=>gain =1. Any digital constant can be used instead of +1. Similarly, the division by $2\hat{}N$ operation equates to positioning the taps from the digital multiplier output, as is known to those skilled in the art, and a different divider factor could also be chosen.

For gains of greater than unity, the range of m+1 is greater than the divider factor d.

The values of m and c, may be stored in a memory 50 which may be on chip 34 but external to digital calibration circuit 32, or they may be contained within digital calibration circuit 32 memory 50' or may be external to both DAC 30 and digital calibration circuit 32 and chip 34 as shown by memory 50". When memory 50" is provided external to chip 34 it may be made accessible and programmable by the user so that not just the input signal x but the offset coefficient c and gain coefficient m may be chosen to compensate for DAC errors or for DAC errors and errors contributed by any one or more of the subsequent analog signal circuits in chain 40.

Figure 4A:
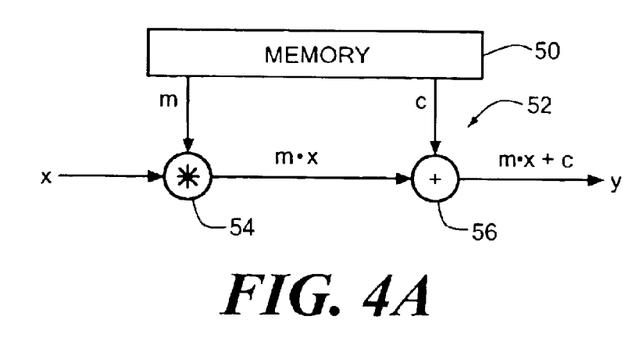
FIGS. 4A–C are more detailed schematic diagrams of a portion of three different embodiments of the digital calibration circuit for applying gain and offset coefficients to compensate for gain and offset errors.
Figure 4B:
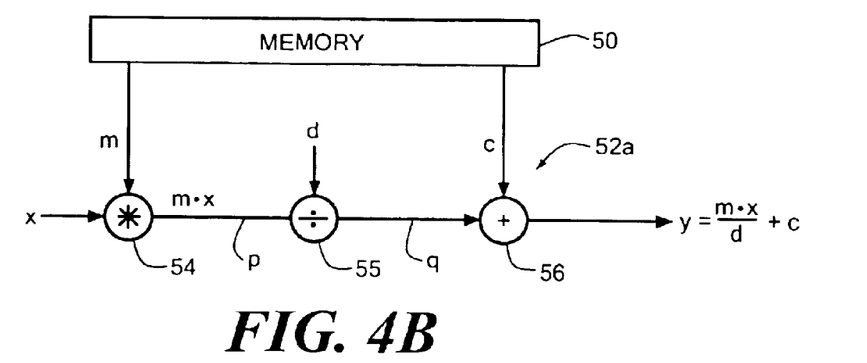

Included in digital calibration circuit 32 is an arithmetic logic unit 33, such as arithmetic circuit 52, FIG. 3, which includes a multiplier 54 and adder 56, FIG. 4. Arithmetic circuit 52 thus performs the equation y=mx+c. It receives the x input to multiplier 54 where it is multiplied by the m coefficient to which is added the c coefficient in adder 56 to produce the output y. Alternatively, arithmetic unit 32a, FIG. 4B, may include an additional divider 55 to obtain the output $$y = \frac{mx}{d} + c.$$

That is, divider 55 divided by d the product p of the DAC input x and gain offset m to obtain a quotient q which is then added to the offset c by adder 56 where d is a divider factor used to scale down the output number. Or as shown at 52b, FIG. 4C, there may be an adder 57 which combines coefficient c2 59 to obtain the output $$y = \frac{(m + c2)**}{d} + c.$$

Figure 4C:
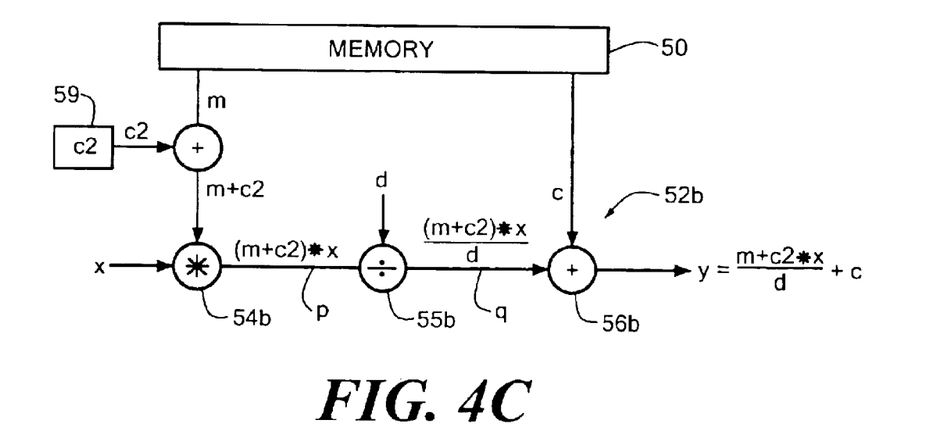

That is, before the gain offset m is multiplied by the DAC input x to obtain product p, the gain offset is combined with a second constant c2, 59.

Figure 5:
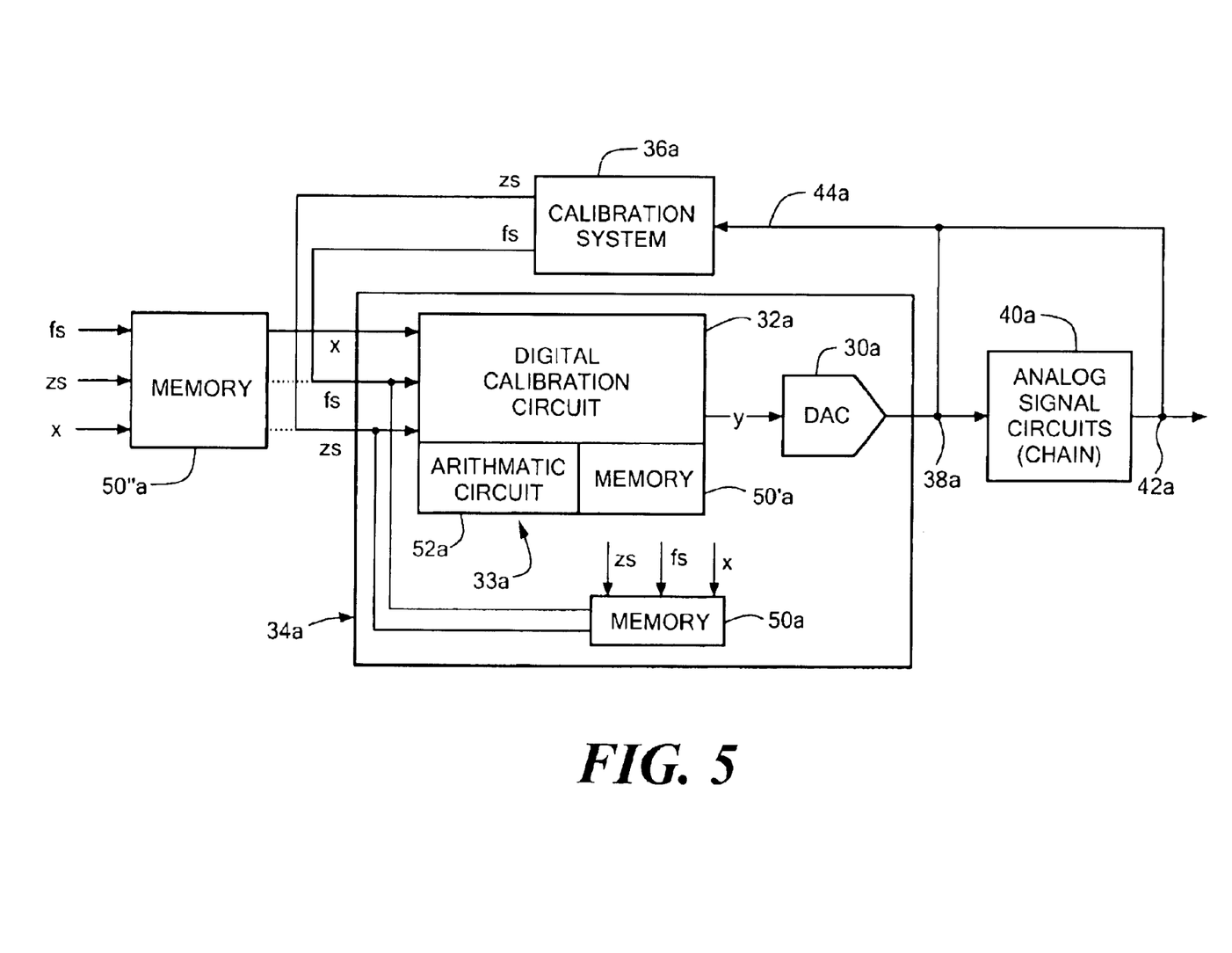
FIG. 5 is a view similar to FIG. 3 of an integrated digital calibration circuit and DAC employing zero scale and full scale coefficients according to this invention.
Figure 6:
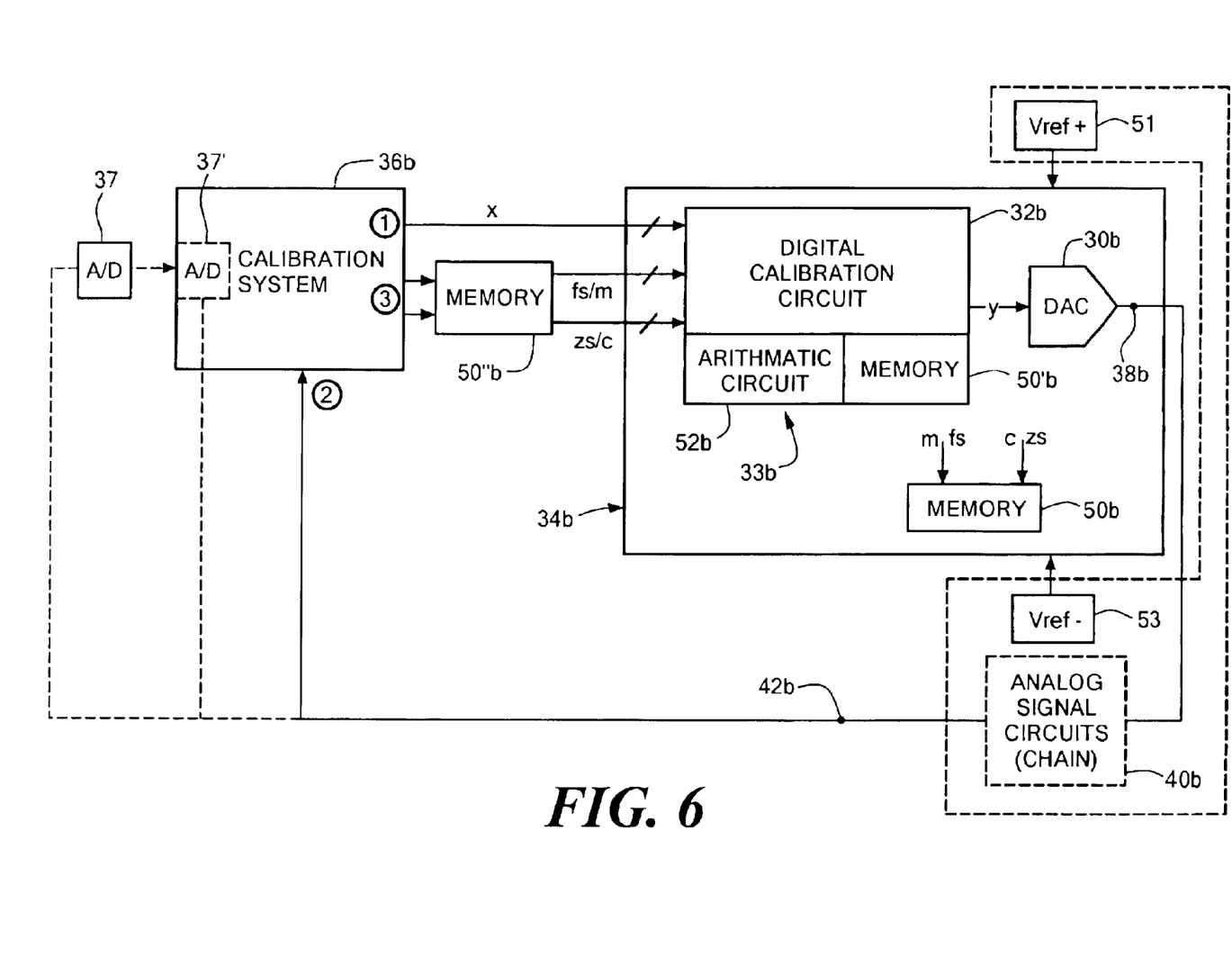
FIG. 6 is a view similar to FIG. 3 of an integrated digital calibration circuit and DAC employing a software driven calibration system according to this invention.

Alternatively, as shown in FIG. 5, the arithmetic circuit 52a in the arithmetic logic unit 33a in digital calibration circuit 32a may produce a zero scale error coefficient, zs, and the full scale coefficient, fs, or may provide them along with input x to digital calibration circuit 32a. In the same way as previously, memory 50a, 50'a, and 50"a may perform in a similar fashion but with respect to full scale coefficient fs and zero scale coefficient zs. Calibration system 36 may include hardware circuits or a combination of hardware circuits and software for sensing the zero scale and full scale outputs in calculating the zs and fs coefficients or the m and c coefficients. Calibration system 36b, FIG. 6, would contain an ADC at its input externally, ADC 37 or internally 37', for converting analog signal circuit chain at 42b to digital format for use in arithmetic operations to calculate the coefficients. Analog signal circuit (chain) 40b may also include $V_{ref+}$ circuit 51 and $V_{ref-}$ circuit 53. It may also be done entirely in software in calibration system 36b, FIG. 6, in three phases, 1, 2, and 3 which may calculate either the zs and fs coefficients or the m and c coefficients as shown in the software flowcharts of FIG. 7.

Figure 7:
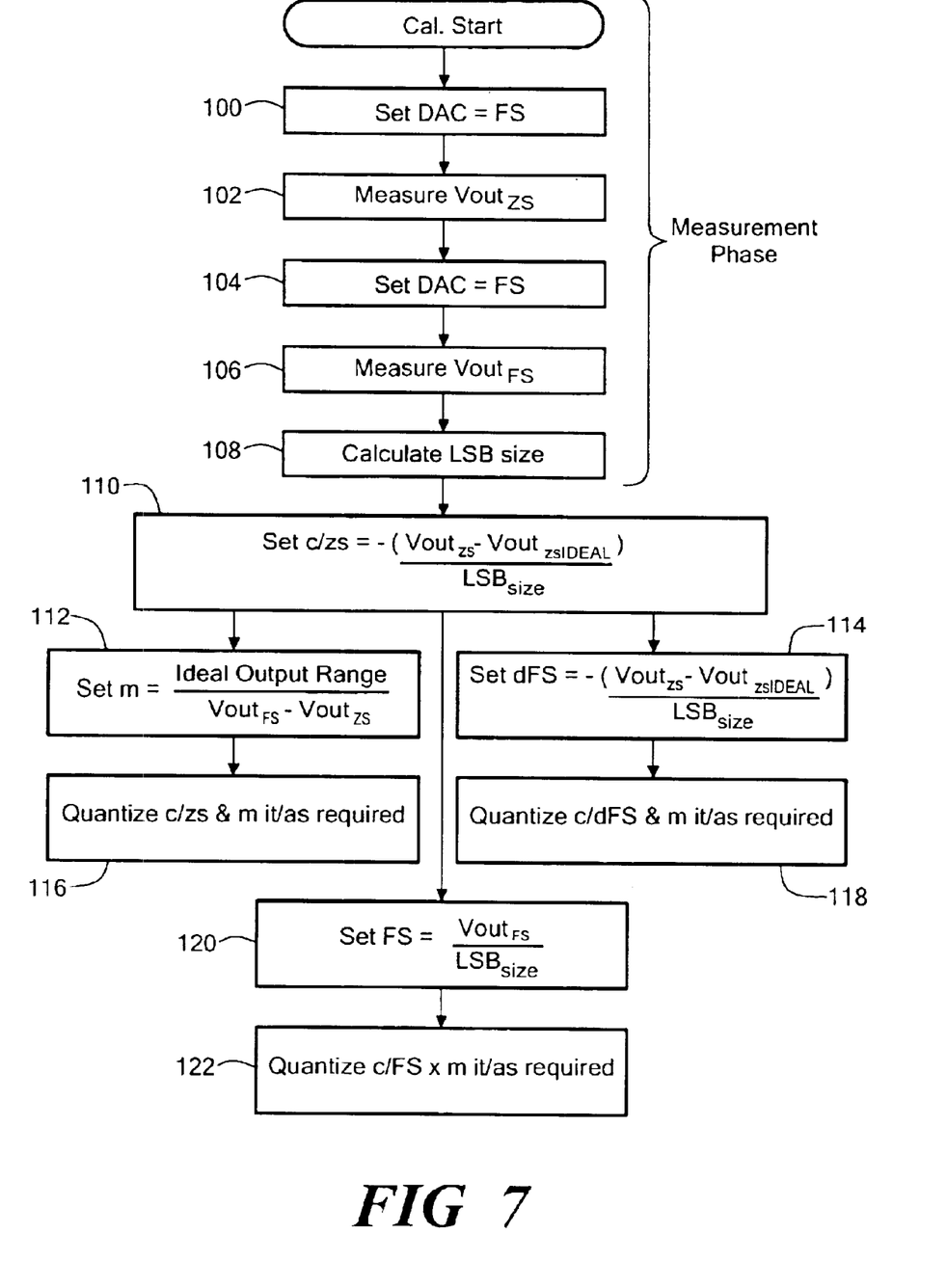
FIG. 7 is a flow chart of the software for operating the calibration system of FIG. 6.

The calibration cycle starts with setting the DAC input at zero, step 100, FIG. 7, and then measuring the voltage/current output, in step 102, of the DAC or of the analog signal circuit chain 40. Then the DAC is set to full scale in step 104 and again the output is measured. In step 106 the output of either DAC 30 or the analog signal circuit chain 40 is used to calculate the coefficients m and c. The LSB size is calculated in step 108. The c/zs terms are calculated in step 110 after which m, step 112 and dfs, step 114 are calculated. Next c/zs and m step 116 and c/zs and fs, step 118 are quantized. fs is calculated, step 120 and c/zs and fs are quantized, 122.

To correct for end point error using the zero scale zs coefficient and the full scale fs coefficient the coefficient zs can be obtained arithmetically by algebraically summing the voltage out at zero scale minus the voltage out at zero scale ideal and normalizing that or dividing it by the least significant bit size.

The full scale correction coefficient fs can be obtained in by algebraically summing the $V_{out}$ full scale minus the $V_{out}$ full scale ideal and normalizing that with the least significant bit size.

Note that the calibration system 36 can include software, a DSP or a microcontroller or other device to effect the determination of m and c or zs and fs.

EXAMPLE 1

Calculates m and c Coefficients to Correct Gain and Offset Errors $V_{ref}+ = 4.096v$
$V_{ref}- = 0v$
DAC resolution, N=12
Therefore, ideal $$LSB = \frac{4.096 - 0}{2^n} = 1mv$$

Step 100=>102=>$V_{outzs}$=−10 mv
Step 100×106=>$V_{outfs}$=4.115v
New Step:

$$\text{Calculate } LSB \text{ size} = \frac{V_{outfs} - V_{outzs}}{2^n - 1} = \frac{4.115 - 0.01}{4095} = 1.002442 mv$$

$$\text{Calculate } c/zs = \frac{-(V_{outzc} - V_{outzcideal})}{LSBsize} = \frac{-(-0.01 - 0)}{LSBsize} = 9.9756$$

Quantize c/zs to required resolution (12b)=>10

$$\text{Calculate } m = \frac{\text{Ideal Output Range}}{V_{outfs} - V_{outzs}} = \frac{4.095}{4.115 - 0.010} = 0.997564$$

Quantize m to required level (12b)=>4086

EXAMPLE 2

Calculating zs and fs Coefficients to Cancel Zero Scale and Full Scale Errors

We can extend example No. 1 and use the same data to calculate new coefficients as follows:

Set dfs =

$$\frac{-(V_{outfs} - V_{outfs-ideal})}{LSBsize} = \frac{-(4.115v - 4.096)}{1.002442mv} = 18.954 = 18.954 \; LSBs$$

Quantizing dfs to 12b (LSB) level: dfs→19 LSBs $$\text{Set } dfs = \frac{V_{outfs}}{LSBsize} = \frac{4.115}{1.002442mv} = 4104.97565$$

Quantizing fs to 12b (LSB) level: fs→4105

Although specific features of the invention are shown in some drawings and not in others, this is for convenience only as each feature may be combined with any or all of the other features in accordance with the invention. The words "including", "comprising", "having", and "with" as used herein are to be interpreted broadly and comprehensively and are not limited to any physical interconnection. Moreover, any embodiments disclosed in the subject application are not to be taken as the only possible embodiments.

Other embodiments will occur to those skilled in the art and are within the following claims:

What is claimed is:

1. An integrated programmable digital calibration circuit and digital to analog converter comprising:
   a digital to analog converter (DAC); and
   a digital calibration circuit including a memory for storing predetermined end point coefficients of said digital to analog converter transfer function, said end point coefficients including a zero scale and a full scale coefficient; and an arithmetic logic unit for applying the end point coefficients to the DAC input signal to adjust the end points of said DAC.

2. The integrated programmable digital calibration circuit and digital to analog converter of claim 1 in which said arithmetic logic unit includes an arithmetic circuit for algebraically counting the zero scale output and ideal output and normalizing them by the least significant bit (LSB) value to obtain the zero scale coefficient and combining the full scale output and ideal output and normalizing them by the LSB to obtain the full scale coefficient and applying those coefficients to the input signal to the DAC.

3. The integrated programmable digital calibration circuit and digital to analog converter of claim 1 in which said digital calibration circuit and DAC are on the same integrated circuit chip.

4. The integrated programmable digital calibration circuit and digital to analog converter of claim 3 in which said memory is in said digital calibration circuit.

5. The integrated programmable digital calibration circuit and digital to analog converter of claim 3 in which said memory is external to said digital calibration circuit.

6. The integrated programmable digital calibration circuit and digital to analog converter of claim 3 in which said memory is a user accessible programmable memory.

7. A programmable digital calibration system including an integrated digital calibration circuit and digital to analog converter comprising:
   a digital to analog converter (DAC);
   an analog signal circuit responsive to said DAC; and
   a digital calibration circuit including a memory for storing the predetermined end point coefficients of said DAC transfer function, said end point coefficients including a zero scale and a full scale coefficient; and an arithmetic logic unit for applying the end point coefficients to the DAC input signal to adjust for the end points of said DAC and said analog signal circuit.

8. The programmable digital calibration system including an integrated digital calibration circuit and digital to analog converter of claim 7 in which said digital calibration circuit and DAC are on the same integrated circuit chip.

9. The programmable digital calibration system including an integrated digital calibration circuit and digital to analog converter of claim 8 in which said memory is in said digital calibration circuit.

10. The programmable digital calibration system including an integrated digital calibration circuit and digital to analog converter of claim 8 in which said memory is external to the digital calibration circuit.

11. The programmable digital calibration system including an integrated digital calibration circuit and digital to analog converter of claim 8 in which said memory is a user accessible programmable memory.

12. A programmable integrated digital calibration circuit and digital to analog converter comprising:
a digital to analog converter; and
a digital calibration circuit including a memory for storing the predetermined offset coefficient and gain coefficient of said digital to analog converter (DAC) and an arithmetic logic unit including an arithmetic circuit having a multiplier circuit for multiplying the DAC input by the gain coefficient and an adder circuit for adding the offset coefficient to said input signal to adjust the gain and offset of said DAC, said arithmetic circuit including a divider circuit for dividing the product of the DAC input and the gain coefficient before adding it to the offset coefficient.

13. The programmable integrated digital calibration circuit and digital to analog converter of claim 12 in which said digital calibration circuit and DAC are on the same integrated circuit chip.

14. The programmable integrated digital calibration circuit and digital to analog converter of claim 12 in which said memory is in said digital calibration circuit.

15. The programmable integrated digital calibration circuit and digital to analog converter of claim 12 in which said memory is external to said digital calibration circuit.

16. The programmable integrated digital calibration circuit and digital to analog converter of claim 12 in which said memory is a user accessible programmable memory.

17. A programmable digital calibration system including an integrated digital calibration circuit and digital to analog converter comprising:
a digital to analog converter (DAC);
an analog signal circuit responsive to said DAC; and
a digital calibration circuit including a memory for storing the predetermined offset coefficient and gain coefficient of said DAC and said analog signal circuit; and an arithmetic logic unit including an arithmetic circuit having a multiplier circuit for multiplying the DAC input by the gain coefficient and an adder circuit for adding the offset coefficient to said input signal to adjust the gain and offset of said DAC and said analog signal circuit, said arithmetic circuit including a divider circuit for dividing the product of the DAC input and the gain coefficient before adding it to the offset coefficient.

18. The programmable integrated digital calibration circuit and digital to analog converter of claim 17 in which said digital calibration circuit and DAC are on the same integrated circuit chip.

19. The programmable integrated digital calibration circuit and digital to analog converter of claim 17 in which said memory is in said digital calibration circuit.

20. The programmable integrated digital calibration circuit and digital to analog converter of claim 17 in which said memory is external to said digital calibration circuit.

21. The programmable integrated digital calibration circuit and digital to analog converter of claim 17 in which said memory is a user accessible programmable memory.

22. A programmable integrated digital calibration circuit and digital to analog converter comprising:
a digital to analog converter (DAC); and
a digital calibration circuit including a memory for storing predetermined zero scale and full scale coefficients of said digital to analog converter (DAC) and an arithmetic logic unit including an arithmetic circuit for algebraically combining the zero scale output and ideal output and normalizing them by the least significant bit (LSB) value to obtain the zero scale coefficient and combining the full scale output and ideal output and normalizing them by the LSB to obtain the full scale coefficient and applying those coefficients to the input signal to the DAC to adjust the zero scale and full scale of said DAC.

23. The programmable integrated digital calibration circuit and digital to analog converter of claim 22 in which said digital calibration circuit and DAC are on the same integrated circuit chip.

24. The programmable integrated digital calibration circuit and digital to analog converter of claim 23 in which said memory is in said digital calibration circuit.

25. The programmable integrated digital calibration circuit and digital to analog converter of claim 23 in which said memory is external to said digital calibration circuit.

26. The programmable integrated digital calibration circuit and digital to analog converter of claim 23 in which said memory is a user accessible programmable memory.

27. A programmable digital calibration system including an integrated digital calibration circuit and digital to analog converter comprising:
a digital to analog converter (DAC);
an analog or mixed signal circuit responsive to said DAC; and
a digital calibration circuit including a memory for storing predetermined zero scale and full scale coefficients of said DAC and said analog signal circuit; and an arithmetic logic unit including an arithmetic circuit for algebraically combining the zero scale output and ideal output and normalizing them by the least significant bit (LSB) value to obtain the zero scale coefficient and combining the full scale output and ideal output and normalizing them by the LSB to obtain the full scale coefficient and applying those coefficients to the input signal of the DAC to adjust for the zero scale and full scale offsets of said DAC and said analog signal circuit.

28. The programmable integrated digital calibration circuit and digital to analog converter of claim 27 in which said digital calibration circuit and DAC are on the same integrated circuit chip.

29. The programmable integrated digital calibration circuit and digital to analog converter of claim 28 in which said memory is in said digital calibration circuit.

30. The programmable integrated digital calibration circuit and digital to analog converter of claim 28 in which said memory is external to said digital calibration circuit.

31. The programmable integrated digital calibration circuit and digital to analog converter of claim 28 in which said memory is a user accessible programmable memory.

32. An integrated digital calibration circuit and digital to analog converter comprising:
a digital to analog converter (DAC); and
a digital calibration circuit including a memory for storing predetermined complements of the end point errors of said digital to analog converter transfer function, said complements of said end point errors including zero scale and full scale error coefficients; and an arithmetic logic unit for applying the complements of the end point errors to the DAC input signal to compensate for the end point errors of said DAC.

33. The integrated digital calibration circuit and digital to analog converter of claim 32 in which said arithmetic logic unit includes an arithmetic circuit for algebraically counting the zero scale output and ideal output and normalizing them by the least significant bit (LSB) value to obtain the zero scale error coefficient and combining the full scale output and ideal output and normalizing them by the LSB to obtain the full scale error coefficient and applying those error coefficients to the input signal to the DAC.

34. The integrated digital calibration circuit and digital to analog converter of claim 32 in which said digital calibration circuit and DAC are on the same integrated circuit chip.

35. The integrated digital calibration circuit and digital to analog converter of claim 34 in which said memory is in said digital calibration circuit.

36. The integrated digital calibration circuit and digital to analog converter of claim 34 in which said memory is external to said digital calibration circuit.

37. The integrated digital calibration circuit and digital to analog converter of claim 34 in which said memory is a user accessible programmable memory.

38. A digital calibration system including an integrated digital calibration circuit and digital to analog converter comprising:
   a digital to analog converter (DAC);
   an analog signal circuit responsive to said DAC; and
   a digital calibration circuit including a memory for storing the predetermined complements of the end point error of said DAC transfer function, said complements of said end point errors including zero scale and full scale error coefficients; and an arithmetic logic unit for applying the complements of the end point errors to the DAC input signal to compensate for the end point errors of said DAC and said analog signal circuit.

39. The digital calibration system integrated digital calibration circuit and digital to analog converter of claim 38 in which said digital calibration circuit and DAC are on the same integrated circuit chip.

40. The digital calibration system integrated digital calibration circuit and digital to analog converter of claim 39 in which said memory is in said digital calibration circuit.

41. The digital calibration system integrated digital calibration circuit and digital to analog converter of claim 39 in which said memory is external to said digital calibration circuit.

42. The digital calibration system integrated digital calibration circuit and digital to analog converter of claim 39 in which said memory is a user accessible programmable memory.

43. An integrated digital calibration circuit and digital to analog converter comprising:
   a digital to analog converter (DAC); and
   a digital calibration circuit including a memory for storing predetermined zero scale and full scale error coefficients of said digital to analog converter (DAC) and an arithmetic logic unit including an arithmetic circuit for algebraically combining the zero scale output and ideal output and normalizing them by the least significant bit (LSB) value to obtain the zero scale error coefficient and combining the full scale output and ideal output and normalizing them by the LSB to obtain the full scale error coefficient and applying those error coefficients to the input signal to the DAC to compensate for the zero scale and full scale errors of said DAC.

44. The integrated digital calibration circuit and digital to analog converter of claim 43 in which said digital calibration circuit and DAC are on the same integrated circuit chip.

45. The integrated digital calibration circuit and digital to analog converter of claim 44 in which said memory is in said digital calibration circuit.

46. The integrated digital calibration circuit and digital to analog converter of claim 44 in which said memory is external to said digital calibration circuit.

47. The integrated digital calibration circuit and digital to analog converter of claim 44 in which said memory is a user accessible programmable memory.

48. A digital calibration system including an integrated digital calibration circuit and digital to analog converter comprising:
   a digital to analog converter (DAC);
   an analog or mixed signal circuit responsive to said DAC; and
   a digital calibration circuit including a memory for storing predetermined zero scale and full scale error coefficients of said DAC and said analog signal circuit; and an arithmetic logic unit including an arithmetic circuit for algebraically combining the zero scale output and ideal output and normalizing them by the least significant bit (LSB) value to obtain the zero scale error coefficient and combining the full scale output and ideal output and normalizing them by the LSB to obtain the full scale error coefficient and applying those error coefficients to the input signal of the DAC to compensate for the zero scale and full scale offset errors of said DAC and said analog signal circuit.

49. The integrated digital calibration circuit and digital to analog converter of claim 48 in which said digital calibration circuit and DAC are on the same integrated circuit chip.

50. The integrated digital calibration circuit and digital to analog converter of claim 49 in which said memory is in said digital calibration circuit.

51. The integrated digital calibration circuit and digital to analog converter of claim 49 in which said memory is external to said digital calibration circuit.

52. The integrated digital calibration circuit and digital to analog converter of claim 49 in which said memory is a user accessible programmable memory.

53. An integrated programmable digital calibration circuit and digital to analog converter comprising:
   a digital to analog converter (DAC); and
   a digital calibration circuit including a memory for storing predetermined endpoint coefficients of said digital to analog converter transfer function; and an arithmetic logic unit for applying the endpoint coefficients to the DAC input signal to adjust the end points of said DAC, said end point coefficients including the offset coefficient and gain coefficient, said arithmetic logic unit including:
      an arithmetic circuit having a multiplier circuit for multiplying the DAC input by the gain coefficient,
      an adder circuit for adding the offset coefficient to said input signal, and
      a divider circuit for dividing the product of the DAC input and the gain coefficient before adding it to the offset coefficient.

54. An integrated programmable digital calibration circuit and digital to analog converter comprising:
   a digital to analog converter (DAC); and
   a digital calibration circuit including a memory for storing predetermined endpoint coefficients of said digital to analog converter transfer function; and an arithmetic logic unit for applying the endpoint coefficients to the DAC input signal to adjust the end points of said DAC, said end point coefficients including the offset coefficient and gain coefficient, said arithmetic logic unit including:
      an arithmetic circuit having a multiplier circuit for multiplying the DAC input by the gain coefficient,
      an adder circuit for adding the offset coefficient to said input signal, and a second adder for combining a second constant with the gain coefficient before it is multiplied by the DAC input.

55. An integrated programmable digital calibration circuit and digital to analog converter comprising:

a digital to analog converter (DAC);

a digital calibration circuit including a memory for storing predetermined end point coefficients of said digital to analog converter transfer function, said end point coefficients including a zero scale and a full scale coefficient; and an arithmetic logic unit for applying the end point coefficients to the DAC input signal to adjust the end points of said DAC, said arithmetic logic unit including an arithmetic circuit for algebraically counting the zero output and ideal output and normalizing them by the least significant bit (LSB) value to obtain the zero scale coefficient and combining the full scale output and ideal output and normalizing them by the LSB to obtain the full scale coefficient and applying those coefficients to the input signal to the DAC.

56. An integrated programmable digital calibration circuit and digital to analog converter comprising;

a digital to analog converter; and a digital calibration circuit including a memory for storing the predetermined offset coefficient and gain coefficient of said digital to analog converter (DAC) and an arithmetic logic unit including an arithmetic circuit having a multiplier circuit for multiplying the DAC input by the gain coefficient and an adder circuit for adding the offset coefficient to said input signal to adjust the gain and offset of said DAC, said arithmetic circuit including a second adder for combining a second constant with the gain coefficient before it is multiplied by the DAC input.

57. A programmable digital calibration system including an integrated digital calibration circuit and digital to analog converter comprising:

a digital to analog converter (DAC)

an analog signal circuit responsive to said DAC;

a digital calibration circuit including a memory for storing the predetermined offset coefficient and gain coefficient of said DAC and said analog signal circuit; and an arithmetic logic unit including an arithmetic circuit having a multiplier circuit for multiplying the DAC input by the gain coefficient and an adder circuit for adding the offset coefficient to said input signal to adjust the gain and offset of said DAC and said analog signal circuit, said arithmetic circuit including a second adder for combining a second constant with the gain coefficient before it is multiplied by the DAC input.

58. An integrated digital calibration circuit and digital to analog converter comprising;

a digital to analog converter (DAC);

a digital calibration circuit including a memory for storing predetermined complements of the end point errors of said digital to analog converter transfer function, said complement of said end point errors including the zero scale and full scale error coefficients; and an arithmetic logic unit for applying the complements of the end point errors to the DAC input signal to compensate for the end point errors of said DAC, said arithmetic logic unit including an arithmetic circuit for algebraically counting the zero scale output and ideal output and normalizing them by the least significant bit (LSB) value to obtain the zero scale error coefficient and combining the full scale output and ideal output and normalizing them by the LSB to obtain the full scale error coefficient and applying those error coefficients to the input signal to the DAC.

* * * * *